(12) United States Patent
Kanai et al.

(10) Patent No.: US 11,437,302 B2
(45) Date of Patent: Sep. 6, 2022

(54) SEMICONDUCTOR MODULE AND METHOD FOR MANUFACTURING THE SAME

(71) Applicant: FUJI ELECTRIC CO., LTD., Kawasaki (JP)

(72) Inventors: Naoyuki Kanai, Matsumoto (JP); Yuichiro Hinata, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/242,812

(22) Filed: Apr. 28, 2021

(65) Prior Publication Data
US 2021/0398880 A1  Dec. 23, 2021

(30) Foreign Application Priority Data

Jun. 23, 2020 (JP) .............................. JP2020-107882

(51) Int. Cl.
| | |
|---|---|
| *H01L 23/49* | (2006.01) |
| *H01L 23/047* | (2006.01) |
| *H01L 23/31* | (2006.01) |
| *H01L 23/373* | (2006.01) |
| *H01L 23/50* | (2006.01) |

(Continued)

(52) U.S. Cl.
CPC .......... *H01L 23/49* (2013.01); *H01L 21/4817* (2013.01); *H01L 21/4871* (2013.01); *H01L 21/4889* (2013.01); *H01L 21/565* (2013.01); *H01L 23/047* (2013.01); *H01L 23/3121* (2013.01); *H01L 23/3735* (2013.01); *H01L 23/50* (2013.01)

(58) Field of Classification Search
CPC ... H01L 23/49; H01L 23/047; H01L 23/3121; H01L 23/50; H01L 21/4817; H01L 21/4871; H01L 21/4889; H01L 21/565
See application file for complete search history.

(56) References Cited

U.S. PATENT DOCUMENTS

2009/0246910 A1 * 10/2009 Taniguchi ............... H01L 24/83
                                                                       438/107
2014/0370663 A1 * 12/2014 Bayerer ................... H01L 23/48
                                                                       438/612

(Continued)

FOREIGN PATENT DOCUMENTS

JP         2014-049582 A       3/2014

*Primary Examiner* — Peniel M Gumedzoe
(74) *Attorney, Agent, or Firm* — Manabu Kanesaka

(57) ABSTRACT

Provided are a semiconductor module capable of easily connecting extraction pin with a wiring board and having reliable connections, and a method for manufacturing the same. A semiconductor module includes: a multilayer board having a semiconductor device mounted thereon, the multilayer board electrically connecting to the semiconductor device; an extraction pin electrically connecting to one of the semiconductor device and the multilayer board; and a wiring board bonded to the extraction pin for electrical connection. The extraction pin has a press-fit. The wiring board has a hole portion bonded with the press-fit of the extraction pin. The base materials of the press-fit of the extraction pin and the hole portion of the wiring board are copper (Cu). A bonded portion between the base materials of press-fit and the corresponding hole portion of the wiring board includes a CuSnNi alloy layer.

13 Claims, 4 Drawing Sheets

(51) Int. Cl.
*H01L 21/48* (2006.01)
*H01L 21/56* (2006.01)

(56) References Cited

U.S. PATENT DOCUMENTS

2018/0337475 A1* 11/2018 Teichmann ............ H01R 12/52
2020/0343655 A1* 10/2020 Ludwig ............. H01R 43/0221

* cited by examiner

SEMICONDUCTOR MODULE AND METHOD FOR MANUFACTURING THE SAME

RELATED APPLICATIONS

The present application is based on, and claims priority from, Japanese Application No. 2020-107882 filed Jun. 23, 2020, the disclosure of which is hereby incorporated by reference herein in its entirety.

BACKGROUND OF THE INVENTION

1. Field of the Invention

The present invention relates to semiconductor modules and methods for manufacturing the same, particularly power semiconductor modules and methods for manufacturing the same.

2. Description of the Related Art

Power semiconductor modules are widely applied in the fields of requiring efficient power conversion. Examples of the fields include those for renewable energy such as solar power generation and wind power generation, which have been attracting attention recently, for vehicles such as hybrid vehicles and electric vehicles, and for railway such as railway vehicles.

Such a power semiconductor module includes a switching device and a diode built therein. For the power semiconductor device, a wide bandgap semiconductor such as a Si (silicon) semiconductor or a SiC (silicon carbide) semiconductor has been used. SiC semiconductor has features of high withstanding voltage, high heat resistance, and low loss as compared with Si semiconductor. A power semiconductor module made of SiC semiconductor therefore enables a compact apparatus and reduces the loss. To produce the apparatus, the power semiconductor device is sealed with a sealing material including epoxy resin, which has excellent moisture resistance, heat resistance, and mechanical properties. This allows the apparatus to have excellent insulating property and keep a shape, and so a caseless and/or baseless structured apparatus can be produced.

To increase the rated current for large capacity, the module has to upsize. In this case, a caseless/baseless structure has several problems, including the stress due to a sealing material and deterioration of the insulation property due to an unfilled inside part (e.g., void) with resin, and this makes it difficult to increase the capacity of the structure.

To achieve large capacity, another way may include producing units each having a small module size to reduce the current capacity per module, and then connecting these units with a busbar. An increase in withstand voltage of the power semiconductor module, however, requires a long insulation distance, which makes it difficult to downsize the entire module.

To solve the above problems, a technique is proposed, which places a semiconductor unit sealed with a sealing material on a base, forms a recess on the upper face of the semiconductor unit, bonds the external terminal pin of the unit to the external terminal busbar, and embeds the joint or bonded portion with resin (Patent Document 1). The document proposes example methods of the bonding, including solder bonding and laser welding. This technique has problems for bonding in the recess, including the difficulties in inserting a soldering iron into the recess or in letting laser light in the recess.

[Patent Document 1] Japanese Unexamined Patent Application Publication No. 2014-49582

SUMMARY OF THE INVENTION

In view of the above problems, the present invention provides a semiconductor module configured for easy connection of extraction pins with a wiring board and having reliable connections, and a method for manufacturing the same.

A semiconductor module according to one aspect of the present invention includes: a multilayer board having a semiconductor device thereon, the multilayer board electrically connecting to the semiconductor device; an extraction pin electrically connecting to one of the semiconductor device and the multilayer board; and a wiring board bonded to the extraction pin for electrical connection.

The extraction pin has a press-fit. The wiring board has a hole portion bonded with the press-fit of the extraction pin. The base materials of the press-fit of the extraction pin and the hole portion of the wiring board are copper (Cu). A bonded portion between the base materials of the press-fit and the hole portion of the wiring board includes a CuSnNi alloy layer.

A method for manufacturing according to another aspect of the present invention includes: mounting a semiconductor device on a multilayer board; vertically disposing an extraction pin which electrically connects to one of the semiconductor device and the multilayer board; and bonding a wiring board to the extraction pins for electrical connection.

The extraction pin has a press-fit. The wiring board has a hole portion bonded with the press-fit of the extraction pin. The base materials of the press-fit of the extraction pin and the hole portion of the wiring board are copper (Cu). A bonded portion between the base materials of each press-fit and the corresponding hole portion of the wiring board includes a CuSnNi alloy layer.

A power semiconductor module according to the present invention enables easy connection of an extraction pin with a wiring board, and has reliable a connection, and the present invention also provides a method for manufacturing the same.

DESCRIPTION OF THE PREFERRED EMBODIMENTS

The following describes some embodiments of the present invention, with reference to the attached drawings. These embodiments can be appropriately modified and be combined for use. In the following description and attached drawings, like numbers indicate like components. The present invention is not limited to the following embodiments.

Figure 1:
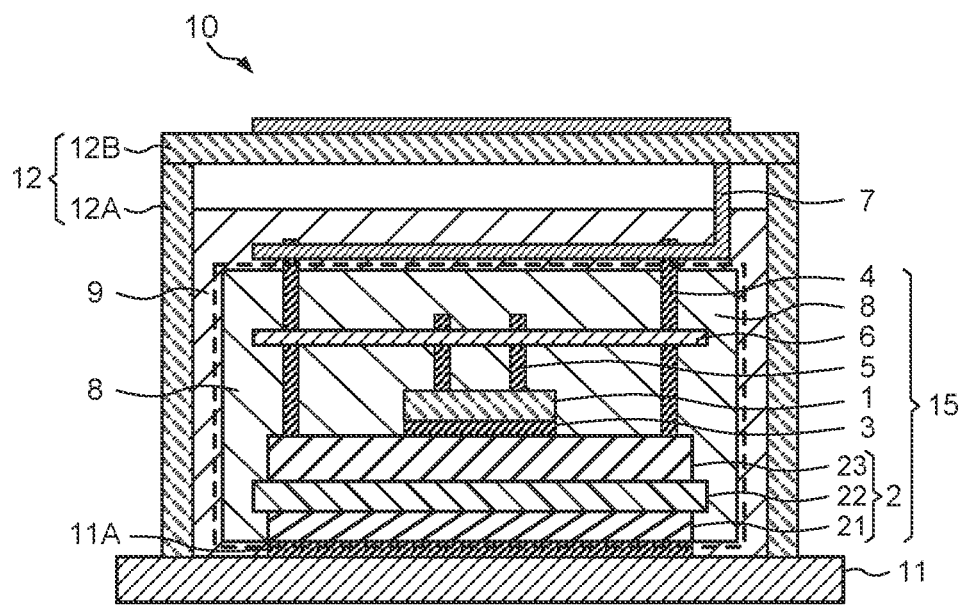
FIG. 1 schematically illustrates the cross-sectional structure of a power semiconductor module 10 according to a first embodiment of the present invention.

FIG. 1 schematically illustrates the cross-sectional structure of a power semiconductor module 10 according to a first embodiment of the present invention. As illustrated in FIG. 1, a power semiconductor device 1 is mounted on a multilayer board 2 via a first bonding layer 3 such as solder.

An implant-type printed circuit board (wiring circuit board) 6 including implant pins 5 is attached to the upper face of the power semiconductor device 1 via a not-illustrated bonding layer such as solder. External terminal pins 4 stand vertically or upright on the upper face of the multilayer board 2 via a not-illustrated bonding layer such as solder.

The multilayer board 2, the power semiconductor device 1, the implant pins 5, and the printed circuit board 6 are all embedded in a first sealing portion 8 made of a first sealing material. The external terminal pins 4 are embedded in the first sealing portion 8, but a part (upper part) of the external terminal pins 4 protrudes from the first sealing portion 8.

The external terminal pins 4 are bonded to an external terminal busbar 7. The external terminal busbar 7 electrically connects to one or more units (power semiconductor modules), if any, and connects to an external device such as an inverter. The multilayer board 2 is bonded to a base 11 via a second bonding layer 11A such as solder. A case and lid 12 is made up of a case 12A and a lid 12B, and the case 12A is mounted on the base 11 via not-illustrated adhesive. A space defined by the base 11 and the case and lid 12 accommodates a second sealing portion 9 made of a second sealing material so as to cover the bonded portion of (or joint between) the external terminal pins 4 and the external terminal busbar 7. They may be mounted directly on a cooler instead of on the base 11.

In the present specification, the upper face and the lower face are relative terms indicating up and down in the drawing for illustrative purposes, and they are not intended to limit the up and down in the usage mode, for example, of the power semiconductor module. The printed circuit board and the external terminal busbar are examples of a wiring board, and they may be referred to as wiring boards.

The power semiconductor device 1 is a power chip such as an IGBT or a diode chip, and this may be various types of Si devices, SiC devices, GaN devices, and more. These devices may be combined for use. In one example, the power semiconductor device 1 may be a hybrid module including a Si-IGBT and a SiC-SBD. The number of power semiconductor devices 1 mounted is not limited to the illustrated mode, and one or more power semiconductor devices 1 may be mounted.

The multilayer board 2 includes an insulating board 22, a second conducting board 21 formed on one of the faces (lower face, i.e., bottom face) of the insulating board 22, and a first conducting board 23 formed on the other face. The insulating board 22 may be made of a material having excellent electrical insulation property and thermal conductivity. Examples of the material of the insulating board 22 include $Al_2O_3$, AlN, SiN, and resin that has excellent thermal conductivity. Especially for high-voltage use, a material preferably has both of the electrical insulation property and the thermal conductivity. To this end, AlN and SiN may be used, and the material is not limited to them.

The second conducting board 21 and the first conducting board 23 may be made of a metal material such as Cu or Al that has excellent workability. For other purposes such as rust prevention, these conducting boards may be made of Cu or Al with Ni-plating. The methods of placing these conducting boards 21 and 23 on the insulating board 22 include direct copper bonding and active metal brazing.

The first bonding layer 3 can be formed with lead-free solder. Examples include Sn—Ag—Cu solder, Sn—Sb solder, Sn—Sb—Ag solder, Sn—Cu solder, Sn—Sb—Ag—Cu solder, Sn—Cu—Ni solder, and Sn—Ag solder, and are not limited to these. The power semiconductor device and the first conducting board 23 undergo heat treatment (reflow) for bonding via the first bonding layer 3.

The printed circuit board 6 may be a polyimide film board or an epoxy film board having a conductive layer such as Cu or Al formed thereon. The implant pins 5 may be copper pins made of copper (Cu). The conductive layer of the printed circuit board 6 and the implant pins 5 may be made of Cu or Al that undergone a treatment such as Ni plating for rust prevention. They may undergo a treatment such as Sn plating for bonding. As described later, after the power semiconductor device 1 is bonded to the multilayer board 2 via the first bonding layer 3 (after reflow), the implant pins 5 are bonded to the upper face of the semiconductor device. After that, the implant pins 5 and the printed circuit board 6 are bonded.

These printed circuit board 6 and implant pins 5 electrically connect one or more power semiconductor devices 1, if any, to each other or between the power semiconductor device 1 and the multilayer board 2. The implant pins 5 and the multilayer board 2 or the power semiconductor device 1 can be bonded via the first bonding layer 3 described above.

The external terminal pins 4 bonded by the first bonding layer 3 or solder as described above extend from the multilayer board 2 to the outside of the first sealing portion 8, and so they function as external connection terminals.

The first sealing portion 8 may be made of an epoxy resin composition including an epoxy base resin and a hardener, which may optionally include an inorganic filler and other additives. Examples of the epoxy base resin include aliphatic epoxy and alicyclic epoxy. Other examples include maleimide resin and cyanate resin, and two or more types including epoxy resin may be mixed for use.

The first sealing portion 8 seals a power semiconductor unit 15, and the power semiconductor unit 15 is mounted on the base 11 via the second bonding layer 11A. In the present embodiment, the portion sealed by the first sealing portion 8 is referred to as a power semiconductor unit (or simply a semiconductor unit) 15, and is indicated by the broken line in the drawing.

The second bonding layer 11A may have excellent thermal conductivity and adhesiveness, and can be bonded with solder, or a sheet adhesive, for example.

As described later, the present embodiment fills the case with the second sealing portion. The upper face of the semiconductor unit 15 therefore can be flat without the need of formation of a recess there. The mold for the semiconductor unit having a flat shape can be produced at low cost, and the cost would otherwise (in the case of a complicated shape) increase.

In one example, the case and lid 12 may be made of resin having excellent insulating properties, and PPS is often used for this purpose.

The following describes an example where the extraction pins are the external terminal pins 4 and the wiring board is the external terminal busbar 7. Specifically the following describes details of the connection between the external terminal pins 4 extending to the outside of the first sealing portion 8 and the external terminal busbar 7.

Figure 2A:
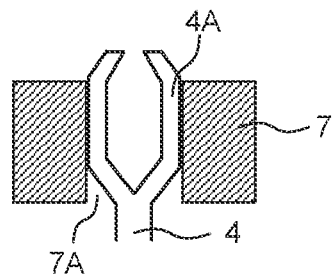
FIG. 2A is a partially enlarged cross-sectional view illustrating the bonded portion of a press-fit structured external terminal pin 4 and an external terminal busbar 7.
Figure 2B:
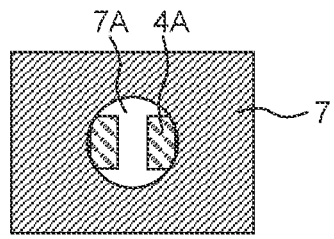
FIG. 2B is a partially enlarged cross-sectional view illustrating the bonded portion of a press-fit structured external terminal pin 4 and an external terminal busbar 7.

Firstly a first mode is described below. The present invention includes the external terminal pins 4 each having a press-fit structure. The press-fit structured pin has a press-fit part in the terminal. Fitting this press-fit part into a hole (through hole) of a board electrically connects the terminal to the board due to the restoring force generated in the press-fit part of the terminal. FIGS. 2A and 2B are partially enlarged cross-sectional views illustrating the joint or bonded portion of the press-fit structured external terminal pin 4 and the external terminal busbar 7. FIG. 2A illustrates a cross section perpendicular to the external terminal busbar 7, and FIG. 2B illustrates a cross section parallel to the external terminal busbar 7.

As illustrated in FIGS. 2A and 2B, the external terminal busbar 7 has a hole portion 7A. The external terminal busbar 7 is a plate having a surface and a rear face. The surface and rear face of the external terminal busbar 7 are relative terms indicating one face and the other face of the plate. For example, the face of the external terminal busbar 7 from which the external terminal pin 4 (press-fitted part) is inserted into the corresponding hole of the external terminal busbar 7 is the rear face (lower face in FIG. 2A), and the face from which the press-fitted part protrudes is the surface (upper face in FIG. 2A).

The external terminal pin 4 has a press-fitted part (hereinafter, also simply referred to as press-fit) 4A. This press-fit 4A is inserted into the hole portion 7A so that the press-fit 4A and the external terminal busbar 7 are bonded.

The shape of the press-fit 4A of the external terminal pin 4 is not particularly limited, which may be any shape enabling insertion into the hole portion 7A of the external terminal busbar 7 for bonding. Preferably the press-fit 4A is of a compliant type having elasticity (springiness).

The present invention is not limited to the example where the external terminal pins 4 are extraction pins and the external terminal busbar 7 is a wiring board. The present invention is applicable also to another example where the extraction pins are implant pins 5 and the wiring board is the printed circuit board 6 and they are connected for bonding.

Figure 2C:
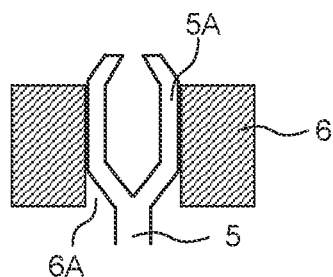
FIG. 2C is a partially enlarged cross-sectional view illustrating the bonded portion of a press-fit structured implant pin 5 and a printed circuit board 6.
Figure 2D:
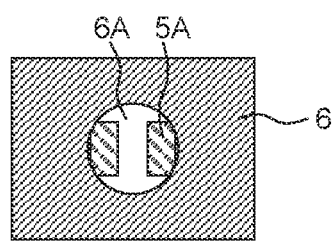
FIG. 2D is a partially enlarged cross-sectional view illustrating the bonded portion of a press-fit structured implant pin 5 and a printed circuit board 6.

More specifically, FIGS. 2C and 2D are partially enlarged cross-sectional views illustrating a bonded portion of the implant pin 5 as the extraction pin and the printed circuit board 6 as the wiring board. FIG. 2C illustrates a cross section perpendicular to the printed circuit board 6, and FIG. 2D illustrates a cross section parallel to the printed circuit board 6.

As illustrated in FIGS. 2C and 2D, the implant pin 5 has a press-fit 5A to be connected to the printed circuit board 6 at one end. This press-fit 5A may be press-fitted into the hole portion 6A of the printed circuit board 6 for bonding. In this case, the implant pin 5 is connected to the power semiconductor device 1 at the other end to stand vertically or upright.

The following describes in details the example where the extraction pins are the external terminal pins 4 and the wiring board is the external terminal busbar 7.

(Press-Fitted Part)

The materials of the external terminal pins 4 and the external terminal busbar 7 are not particularly limited, and a metal material such as Cu having excellent conductivity may be used. To enhance the reliability of the bonded portion of the external terminal pins 4 and the external terminal busbar 7, the press-fit 4A and the hole portion 7A of the external terminal busbar 7 are plated. Specifically, a plating film may be formed on the inner face of the hole portion 7A, and may also be formed around the hole portion 7A in predetermined areas (wiring) on the surface and the rear face of the external terminal busbar 7.

Figure 3:
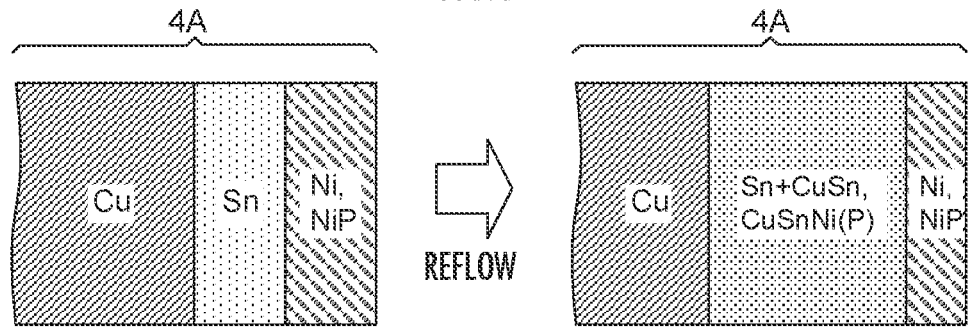
FIG. 3 is a schematic cross-sectional view of the plating structure on the surface of the press-fit 4A.

FIG. 3 is a schematic cross-sectional view of the plating structure on the surface of the press-fit 4A. The press-fit 4A includes Cu as the base material. A Sn layer is plated on the base material (Cu) of the press-fit 4A, and a Ni or Ni alloy layer is plated on the Sn (the drawing on the left of FIG. 3). That is, the press-fit 4A includes the Ni or Ni alloy layer (surface layer), the Sn layer (intermediate layer), and Cu (base material) from the surface, and it is described as Cu/Sn/(Ni or Ni alloy).

The base material may be Cu or Cu alloy containing Cu as a main component. Containing as the main component refers to Cu of 90% or more.

The Sn layer (intermediate layer) contains Sn as a main component. Specifically it preferably includes Sn of 90% or more. Sn has a relatively low melting point of 232° C. and forms alloy with Cu and Ni near the melting point temperature, so it can be bonded to Cu and Ni. Sn therefore has the function of a bonding material. The thickness of the Sn layer is preferably 0.5 μm to 10 μm, more preferably 1 to 4 μm. The Sn layer with the thickness in this range easily forms an intermetallic compound described later. To form a uniform layer for a press-fit having a complicated shape, plating is preferable, such as electroplating and electroless plating.

The surface layer has a role as a protective layer that prevents oxidation of Cu as the base material and the Sn layer, and protects them from scratching. Ni or Ni alloys such as NiP and NiB are used for the surface layer. Similarly to the Sn layer, plating is preferable to form a uniform protective layer for a press-fit having a complicated shape, such as electroplating or electroless plating. Ni alloy plating film such as NiP and NiB is preferable because they have self-lubricating properties and are resistant to wearing.

The thickness of the Ni or Ni alloy in the surface layer is preferably in the range of 0.1 to 1 μm, more preferably in the range of 0.1 to 0.5 μm. This range allows most of the metal to diffuse into the Sn layer during reflow described later to form an intermetallic compound. In the case of the NiP layer, the surface layer preferably contains phosphorus (P) in the range of 3 to 12 wt %, and more preferably has a low phosphorus concentration of 3 to 7 wt %. Such a NiP layer having a low phosphorus concentration makes it hard to form a phosphorus-rich layer during bonding by reflow. This reduces the peeling at the interface. In the case of NiB as well, the B concentration is preferably 1 to 6 wt %, and more preferably 1 to 4 wt % from the viewpoint of binding to Sn. Hereinafter, NiP is described for the Ni alloy, and the same reaction will occur for NiB. For example, NiP, Sn, and Cu react to form a CuSnNiP alloy phase. In the case of NiB, a CuSnNiB alloy phase will be formed.

In the present specification, the layers including CuSnNi alloy phase as well as CuSnNiP alloy phase or CuSnNiB alloy phase containing P or B are collectively called a CuSnNi alloy layer. The layers including the domain of CuSnNi alloy phase as well as of CuSnNiP alloy phase or CuSnNiB alloy phase containing P or B are collectively called a CuSnNi alloy layer.

(Reaction by Reflow)

The press-fit 4A, including the Sn layer and the Ni or Ni alloy layer (NiP) formed on the base material (Cu), undergoes the reflow (heating) during the bonding of the power semiconductor device 1 to the multilayer board 2 via the first bonding layer 3. During this reflow, Sn phase and CuSn alloy phase are formed between the Cu and the Ni or Ni alloy layer (NiP), and a reactive layer of CuSnNi alloy phase and/or CuSnNiP alloy phase is also formed there (the drawing on the right of FIG. 3). That is, the press-fit 4A after the reflow has the structure of Cu/(Sn, CuSn and CuSnNi and/or CuSnNiP)/(Ni or Ni alloy), which is viewed from the base material. The reflow temperature is 220° C. to 420° C., and is appropriately selected depending on the material of the first bonding layer 3. Specifically, the temperature is 250° C. to 420° C. for the above-mentioned solder material. The temperature is 220 to 300° C. for an Ag sintered material, for example.

As described above, when heated in these temperature ranges, the base metal Cu and Sn in the Sn layer are solid-melted and alloyed near the interface between the base material (Cu) and the Sn layer to form a Cu—Sn intermetallic compound (Cu—Sn alloy phase), such as Cu3Sn and Cu6Sn5.

Between the Sn layer (intermediate layer) and the Ni or Ni alloy layer (surface layer), Ni is diffused. This forms a Ni—Sn intermetallic compound (Ni—Sn alloy phase) and a Ni—Cu—Sn intermetallic compound (Ni—Cu—Sn alloy phase) such as (Cu, Ni)3Sn or (Cu, Ni)6Sn5 where Ni is replaced with Cu. When the surface layer is NiP, a part of P is also contained in the intermetallic compound, so that a Ni—Cu—Sn—P intermetallic compound (Ni—Cu—Sn—P alloy phase) is also formed. Such intermetallic compounds formed prevents the development of cracks even when stress is applied, and so enhances the strength. The Ni or Ni alloy layer (surface layer) preferably remains about 0.1 to 0.2 μm from the viewpoint of wear resistance during fitting into the hole.

As a result, as illustrated in the drawing on the right of FIG. 3, a layer (reactive layer) is formed in the Sn layer (intermediate layer) where the Sn phase, the Cu—Sn alloy phase, the Ni—Sn alloy phase, the Ni—Cu—Sn alloy phase, and the Ni—Cu—Sn—P alloy phase are mixed, and so this achieves strong adhesion.

The thickness ratio (described as Ni/Sn) between the Sn layer and the Ni alloy layer before reflow affects the formation of the intermetallic compound, and also affects the adhesion. Specifically, Ni/Sn is preferably 0.01 to 1, more preferably 0.025 to 0.5.

When the surface layer is a NiP layer, the above-stated heat treatment diffuses Ni to the Sn layer at the interface between the Sn layer and the NiP layer, which may be low-phosphorus layer, and so a region with a high P content (phosphorus-rich layer) may be relatively formed. This phosphorus-rich layer is brittle, and easily peels off. To prevent this, the thickness ratio of the Sn layer and the NiP layer is set within the above range, and this press-fit is fitted into the hole portion 7A and heated for bonding as described later. Then, Ni and P of the NiP layer are diffused into the Sn layer (CuSn etc.) to form CuSnNi alloy phase and/or CuSnNiP alloy phase. In this way, the phosphorus-rich layer is not clearly formed at the interface between CuSn or the like of the press-fit 4A of FIG. 4 and the NiP layer, and peeling does not occur.

That is, the structure of the present invention protects the Sn layer from oxidation and forms an intermetallic compound, and so enhances the strength and adhesion. This also suppresses the formation of a phosphorus-rich layer and prevents peeling, for example.

(Hole Portion)

Figure 4:
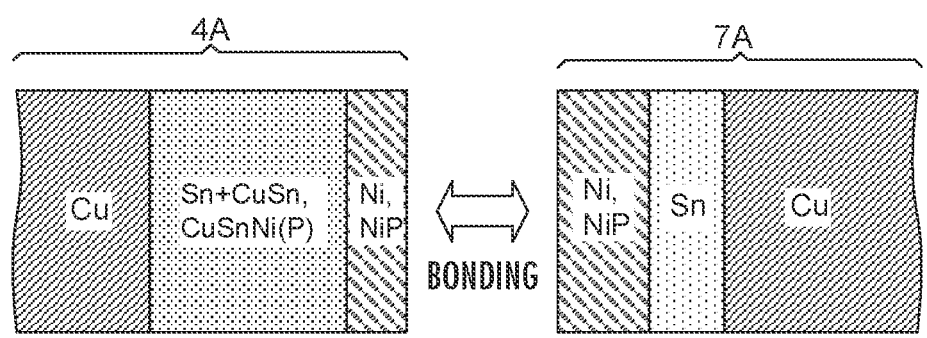
FIG. 4 is a schematic cross-sectional view illustrating the structure of the surface parts of the press-fit 4A and the hole portion 7A of the external terminal busbar 7 when the press-fit 4A is press-fitted into the hole portion 7A and before bonding.

FIG. 4 schematically illustrates a cross section of the surface parts of the press-fit 4A and the hole portion 7A of the external terminal busbar 7 when the press-fit 4A is press-fitted into the hole portion 7A of the external terminal busbar 7 after the reflow and the formation of the first sealing portion 8, and before they are bonded. The inner wall surface of the hole portion 7A of the external terminal busbar 7 with which the press-fit 4A comes into contact has the structure of Ni or NiP (surface layer), Sn (intermediate layer), and Cu (base material) viewed from the surface.

Preferably the base material of a part defining the hole portion 7A is Cu or a Cu alloy containing Cu as a main component. Containing as the main component refers to Cu of 90%6 or more. The base material of the press-fit 4A also preferably has the same composition as the base material of the hole portion 7A.

Preferably the intermediate layer of the inner wall surface of the hole portion 7A is the same as the intermediate layer of the press-fit 4A as stated above. Preferably the surface layer of the inner wall surface of the hole portion 7A has the same composition as that of the surface layer of the press-fit 4A as stated above.

(Structure after Heat Bonding)

Figure 5:
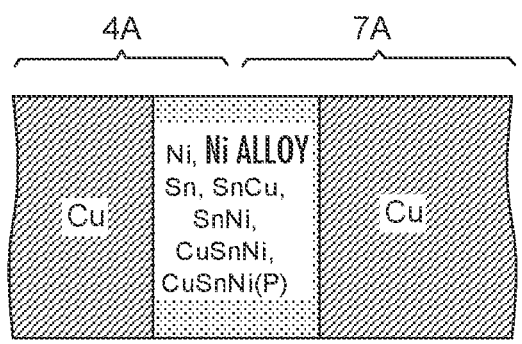
FIG. 5 is a schematic cross-sectional view illustrating the bonding interface after the heat treatment of the press-fit 4A and the hole portion 7A of the external terminal busbar 7.

FIG. 5 schematically illustrates a cross section of the bonded interface between the press-fit 4A and the hole portion 7A of the external terminal busbar 7 when the press-fit 4A is press-fitted into the hole portion 7A of the external terminal busbar 7, and is heat bonded (heat treatment). As illustrated in FIG. 5, the heat bonding (heat treatment) between the press-fit 4A and the hole portion 7A of the external terminal busbar 7 forms a bonding layer between the base materials (Cu) of the press fit 4A and the external terminal busbar 7. In this bonding layer, Sn phase, Ni or NiP phase, Cu—Sn alloy phase, Ni—Sn alloy phase, CuSnNi alloy phase, and/or CuSnNiP alloy phase (hereinafter described as CuSnNi(P) phase), which is a layer containing a small amount of P (phosphorus), are formed to bond the press-fit 4A and the hole portion 7A of the external terminal busbar 7. Preferably the heat bonding as stated above is performed at a temperature in the range of 200° C. to 300° C. for 5 to 30 minutes. Note here that the thicknesses of the Ni or Ni alloy layer of the surface layers of the press-fit 4A and the hole portion 7A of the external terminal busbar 7 and the thicknesses of their Sn intermediate layers may have the above-mentioned predetermined ratio. Such a ratio allows most of the Ni or NiP to be consumed for a reaction with Sn during heat bonding. This means that the ratio of the Ni phase or NiP phase remaining in the bonding layer is 5% or less.

The Sn phase ratio of the bonding layer is preferably 0% to 50%. This range achieves high adhesiveness. When the Sn phase is from 0% to less than 20% in the bonding layer, that is, when the bonding layer mainly includes alloy phases including NiP phase, Cu—Sn alloy phase, Ni—Sn alloy phase, CuSnNi alloy phase, and/or CuSnNiP alloy phase slightly including P (phosphorus), the bonding layer will have high rigidity and high adhesion, and so has enhanced vibration resistance and impact resistance. Such a bonding layer, however, is brittle to some extent, and so cracks or the like may occur slightly. The Sn phase therefore preferably is 20% to 50%. The Sn phase in this range does not cause cracks or the like if thermal stress is applied, and so a reliable module can be achieved.

The thickness ratio of the Sn layer and the NiP layer of the press-fit 4A and the hole portion 7A of the external terminal busbar 7 in the above range achieves the above-stated range of the Sn phase and other alloy phases.

This ratio of the Ni or NiP phase and the Sn phase is obtained by image processing a cross-sectional scanning electron microscope (SEM) image to identify the area ratio of the Ni or NiP phase and the Sn phase. The observation area measures 20 μm by 20 μm.

More specifically, the surface layer (NiP layer) of the press-fit 4A and the inner wall surface layer (NiP layer) of the hole portion 7A are diffused into the intermediate layers (alloy layer such as Sn layer) of the press-fit 4A and the inner wall of the hole portion 7A, and form a bonding layer including a Cu—Sn alloy phase, a Ni—Sn alloy phase, a CuSnNi alloy phase, and/or a CuSnNiP alloy phase, which is a layer containing a small amount of phosphorus (P), in addition to Sn phase and NiP phase.

In this way, the heat treatment to bond the power semiconductor device 1 with the multilayer board 2 forms an alloy layer at the interface between the base material (Cu) of the press-fit 4A and the plating layer, which enhances the adhesiveness between the base material (Cu) and the plating layers (surface layer, intermediate layer). The press-fit 4A is press-fitted into the hole portion 7A of the external terminal busbar 7, and the bonding (heat treatment) then is conducted to form a bonding layer between the press-fit 4A and the hole portion 7A of the external terminal busbar 7, which enhances the bonding strength. Specifically, the alloy phases formed in the bonded portion prevent extension of cracks, and so enhance the mechanical strength.

Such a structure therefore prevents defects such as poor adhesion and peeling due to the heat history during manufacturing, and achieves the bonding between the external terminal pins 4 and the external terminal busbar 7 having high adhesion strength and bonding strength.

In a second mode, one of the press-fit 4A and the hole portion 7A may include a NiP layer (surface layer). In this case, the Sn layer will be exposed, and so oxides are formed on the Sn surface. Ni or the like therefore is less likely to diffuse to the Sn layer. With this configuration, whereas the adhesion is slightly inferior to that of the first mode, the reliability in the heat cycle (H/C) test, for example, is good.

In a third mode, Sn is not formed on the base material (Cu) of the press-fit 4A, and a Ni or NiP alloy layer (surface layer) may be formed directly on the Cu (base material).

The embodiment of the present invention includes the second sealing portion 9 so as to cover the bonded portion of the external terminal pins 4 and the external terminal busbar 7. The second sealing portion 9 is just to cover the bonded portion of the external terminal pins 4 and the external terminal busbar 7, and this may be made of sealing resin or silicone gel, for example.

As illustrated in FIG. 1, the first embodiment is configured so that the second sealing portion 9 covers the bonded portion of the power semiconductor unit 15 having a flat upper face. This configuration does not need attention to an insulating distance between the external terminal pins 4 and between the external terminal pin 4 and the conducting board 23 to produce the power semiconductor unit 15. In particular, high withstanding voltage requires a long insulating distance, and so conventional power semiconductor units are required to upsize. In contrast, the power semiconductor unit of the present embodiment can be compact. Such a flat upper face of the power semiconductor unit 15, which means that the power semiconductor unit 15 itself is a three-dimensional object having no unevenness like a cuboid, leads to an advantage of preventing stress concentration due to thermal stress.

Figure 6:
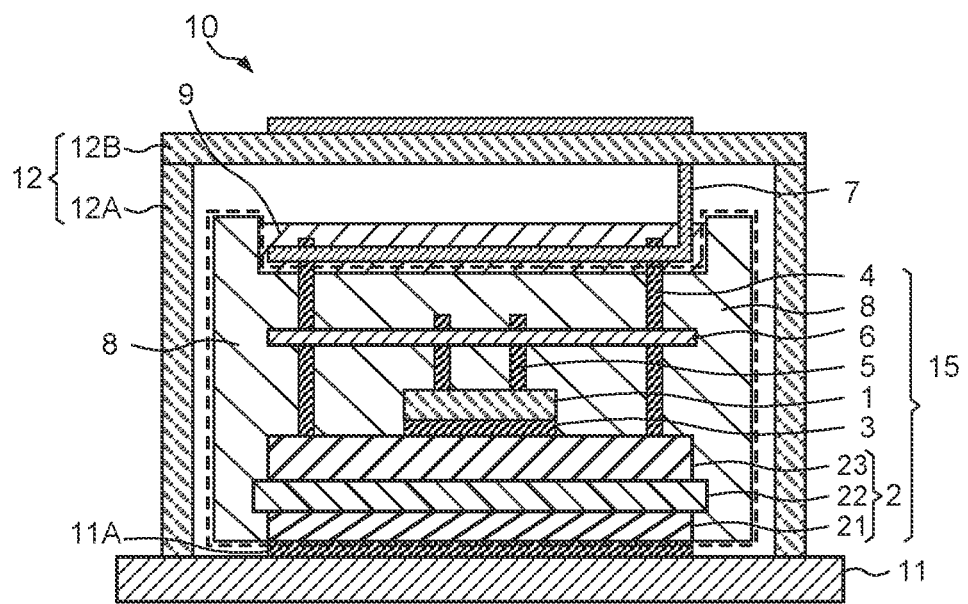
FIG. 6 schematically illustrates the cross-sectional structure of a power semiconductor module 10 having a recess on the surface (upper face) of the first sealing portion 8.

As illustrated in FIG. 6 (Example 2), a second embodiment may be configured so that the power semiconductor unit 15 has a recess on the upper face where the bonded portion is exposed and this recessed bonded portion is covered with resin.

Similarly to the first embodiment, the second embodiment enhances the electrical insulation because the bonded portion is covered with resin, and so does not need attention to an insulating distance between the external terminal pins 4 and between the external terminal pin 4 and the conducting board 23. Such a recess on the upper face of the power semiconductor unit 15 reduces the size of the second sealing portion, and so leads to an advantage of reducing the volume of the sealing portion of the power semiconductor module. This reduction in volume also reduces the strain of the sealing portion of the power semiconductor module due to thermal stress.

EXAMPLES

The following describes the present invention in more details by way of examples. The present invention is not limited to the following examples.

Example 1

A power semiconductor module for evaluation was prepared as follows. The multilayer board 2 was a Denka SN plate (manufactured by Denka company limited, frame length 1.0 mm) having a conductive board thickness of 0.3 mm and an insulating board thickness of 0.32 mm.

Solder 3 and a power semiconductor device 1, solder and implant pins 5, external terminal pins 4, and a printed circuit board 6 were solder-bonded for mounting on the multilayer board 2 in a $N_2$ reflow furnace. Next, these members to be sealed were set in the mold.

Aliphatic epoxy base resin: jER630 (manufactured by Mitsubishi Chemical Corporation), hardener: jER Cure 113 (manufactured by Mitsubishi Chemical Corporation), and inorganic filler: Excelica having the average particle size of several μm to several tens of μm (Tokuyama) were mixed at the mass ratio 10:5:3, followed by vacuum defoaming, and the mixture was then poured into the mold. This was first cured at 100° C. for 1 hour and then second cured at 150° C. for 3 hours to form a first sealing portion 8. That is, a power semiconductor unit 15 was produced, which had a flat surface, and at least the press-fits 4A of the external terminal pins 4 protruded from the first sealing portion 8.

Subsequently, the produced power semiconductor unit 15 was bonded with solder to an AlSiC base (manufactured by Denka company limited.) having a thickness of 5 mm.

Subsequently, a case was mounted with adhesive, and the external terminal pins 4 each were press-fitted into the corresponding hole portion 7A of the external terminal busbar 7. Next, heat treatment was conducted to bond each press-fit 4A and the corresponding hole portion 7A of the external terminal busbar 7, during which a CuSnNi alloy layer or a CuSnNi (P) layer was formed at the interface between the press-fit 4A and the hole portion 7A of the external terminal busbar 7 (see FIG. 5). That is, a CuSnNi alloy layer or a CuSnNi (P) layer was formed between the base material (Cu) of the press fit 4A and the base material (Cu) of the hole portion 7A of the external terminal busbar 7.

Next, silicone gel (TSE3051SK, manufactured by Momentive Performance Materials Japan) was poured to cover the insertion part, was defoamed, and was heat-treated at 100° C. for 1 hour for curing to seal the power semiconductor unit 15 with the second sealing portion 9.

Finally, a lid 12B was placed to produce a power semiconductor module 10. The external terminal pins had a Cu/Sn/NiP layer structure where a Sn layer (intermediate layer) and a NiP layer (surface layer) were placed on the Cu material (base material). The thickness of the Sn layer was 10 μm, and the thickness of the NiP layer was 0.5 μm. These layers were formed by electroless plating, and P concentration of the NiP layer was 6%. The inner wall surface of the holes of the external terminal busbar 7 had the same surface structure as that of the external terminal pins.

(Evaluations)

After that, a heat cycle (H/C) test was conducted for a reliability test. Then electrical characteristics, including I-V characteristics (current/voltage characteristics) and disconnection, were evaluated, and the connections of the press-fits 4A were visually observed. In the H/C test, the power semiconductor module was operated for 500 cycles at an environmental temperature of −40° C. to 150° C. The power semiconductor module without abnormality after 300 cycles was evaluated as pass.

The heat treatment after press-fitting the press-fit 4A into the hole portion 7A of the external terminal busbar 7 may be performed after the reflow to bond the semiconductor device 1 with the multilayer board 2. That is, the press-fit 4A may be press-fitted into the hole portion 7A of the external terminal busbar 7 before or after bonding the power semiconductor unit 15 with the base 11. This heat treatment of the press-fit 4A and the hole portion 7A of the external terminal busbar 7 may be performed before or after bonding the power semiconductor unit 15 to the base 11. The heat treatment to bond (reflow) the power semiconductor unit to the base 11 may be used as this heat treatment.

Example 2

A power semiconductor module 10 as illustrated in FIG. 6 was prepared similar to Example 1 except that the surface (upper face) of the first sealing portion 8 had a recess.

More specifically, a recess was formed on the upper face of the first sealing portion 8, and the bonded portion of the press-fits 4A and the external terminal busbar 7 was exposed in the recess. A sealing material was poured into the recess and cured to form the second sealing portion 9. That is, the bonded portion of the press-fits 4A and the external terminal busbar 7 was embedded in the second sealing portion 9.

Comparative Example 1

In Comparative Example 1, the external terminal pins 4 were made of Cu as the base material, and the surface of the base material (Cu) of the press-fits 4A was Sn-plated (Cu/Sn). The external terminal busbar 7 was made of Cu as the base material, and the holes 7A of the external terminal busbar 7 were made of Cu, the surface of which was Sn-plated (Cu/Sn). Other points, including reflow and heating for bonding, were the same as in the above examples.

Comparative Example 2

In Comparative Example 2, the external terminal pins 4 were made of Cu as the base material, and the surface of the base material (Cu) of the press-fits 4A was NiP-plated (intermediate layer). The NiP layer was then Sn-plated (surface layer) (Cu/NiP/Sn). The external terminal busbar 7 were made of Cu as the base material. The base material (Cu) of the holes 7A of the external terminal busbar 7 was NiP-plated (intermediate layer), and then the NiP layer was Sn-plated (surface layer) (Cu/NiP/Sn). Other points, including reflow and heating for bonding, were the same as in the above examples.

The H/C test showed that no abnormality occurred for the electrical characteristics in Examples 1 and 2, and no abnormality such as breakage or discoloration occurred at the bonded portion of the press-fits 4A and the holes 7A of the external terminal busbar 7. These examples therefore were accepted (pass).

In contrast, abnormality occurred in the I-V characteristics of Comparative Example 1 before 300 cycles, and the bonded portion of the press-fit 4A and the hole portion 7A of the external terminal busbar 7 also peeled off at a part of the interface between the press-fit 4A and the hole portion 7A. Comparative Example 2 had breakage and peeling inside the bonded portion of the press-fit 4A and the hole portion 7A.

Presumably Comparative Example 1 generated the peeling due to thermal stress because the Sn layers of the press-fit 4A and the inner wall of the hole portion 7A were oxidized and became brittle. Presumably this is because oxidation of the Sn layers hindered a reaction between the Sn layers at the bonded portion of the press-fit 4A and the hole portion 7A, and so peeling occurred due to thermal stress. Presumably Comparative Example 2 generated the peeling because the Sn layers of the press-fit 4A and the inner wall of the hole portion 7A were oxidized and became brittle, and a phosphor-rich layer was formed between the NiP layer and the Sn layer. Presumably similarly to Comparative Example 1, the Sn layers did not react well at the bonded portion of between the press-fit 4A and the hole portion 7A, and so peeling occurred due to thermal stress.

Comparison between Examples and Comparative Examples about the number of cycles of the H/C test until the abnormality occurred shows that Examples improved by about 30%.

The present invention includes a press-fitting extraction pins, and this facilitates the bonding of the extraction pins of the power semiconductor unit and the wiring board. The press-fit of the extraction pin highly adheres to the wiring board, and so the resultant power semiconductor module hardly generates peeling and so is reliable.

The above describes a power semiconductor module equipped with a power semiconductor device. The present invention is also applicable to a semiconductor module equipped with a general semiconductor device.

1 Power semiconductor device
2 Multilayer board
21 Second conducting board
22 Insulating board
23 First conducting board
3 First bonding layer
4 External terminal pin
4A Press-fit
5 Implant pin
5A Press-fit
6 Printed circuit board (wiring circuit board)
6A Hole
7 External terminal busbar
7A Hole
8 First sealing portion 9 Second sealing portion
11A Second bonding layer
11 Base
12 Case and lid
15 Power semiconductor unit

What is claimed is:

1. A semiconductor module comprising:
    a multilayer board having a semiconductor device thereon, the multilayer board electrically being connected to the semiconductor device;
    an extraction pin electrically connecting to one of the semiconductor device and the multilayer board; and
    a wiring board bonded to the extraction pin for electrical connection,
    the extraction pin having a press-fit, the wiring board having a hole portion bonded with the press-fit of the extraction pin, base materials of the press-fit of the extraction pin and the hole portion of the wiring board are copper (Cu), a bonded portion between the base materials of the press-fit and the hole portion of the wiring board including a CuSnNi alloy layer.

2. The semiconductor module according to claim 1, wherein the extraction pin is an external terminal pin standing vertically on the multilayer board, and the wiring board is an external terminal busbar bonded to the external terminal pin for electrical connection.

3. The semiconductor module according to claim 1, wherein the extraction pin is an implant pin standing vertically on the semiconductor device, and the wiring board is a wiring circuit board bonded to the implant pin for electrical connection.

4. The semiconductor module according to claim 2, further comprising a first sealing portion embedding at least the multilayer board, the semiconductor device, and a part of the external terminal pins, wherein
    the external terminal busbar is bonded for electrical connection to the external terminal pin protruding from the first sealing portion.

5. The semiconductor module according to claim 1, further comprising a sealing portion sealing the bonded portion of the press-fit and the wiring board.

6. The semiconductor module according to claim 1, wherein a ratio of Sn phase in the bonded portion ranges from 0% to 50%.

7. A method for manufacturing a semiconductor module, comprising:
    mounting a semiconductor device on a multilayer board;
    vertically disposing an extraction pin which electrically connects to one of the semiconductor device and the multilayer board; and
    bonding a wiring board to the extraction pin for electrical connection,
    the extraction pin having a press-fit, the wiring board having a hole portion bonded with the press-fit of the extraction pin, base materials of the press-fit of the extraction pin and the hole of the wiring board are copper (Cu), a bonded portion between the base materials of the press-fit and the hole portion of the wiring board including a CuSnNi alloy layer.

8. The method of manufacturing a semiconductor module according to claim 7, wherein the extraction pin is an external terminal pin standing vertically on the multilayer board, and the wiring board is an external terminal busbar bonded to the external terminal pin for electrical connection.

9. The method for manufacturing a semiconductor module according to claim 7, wherein the extraction pin is an implant pin standing vertically on the semiconductor device, and the wiring board is a wiring circuit board bonded to the implant pin for electrical connection.

10. The method for manufacturing a semiconductor module according to claim 8, further comprising disposing a first sealing portion to embed at least the multilayer board, the semiconductor device, and a part of the external terminal pins, wherein
    the external terminal busbar is bonded for electrical connection to the external terminal pin protruding from the first sealing portion.

11. The method for manufacturing a semiconductor module according to claim 7, further comprising sealing the bonded portion of the press-fit and the wiring board.

12. The method for manufacturing a semiconductor module according to claim 7, wherein a ratio of Sn phase in the bonded portion ranges from 0% to 50%.

13. The method for manufacturing a semiconductor module according to claim 7, wherein, before bonding the wiring board to the extraction pin, a surface of the extraction pin has a layer structure of Cu/Sn/(Ni or Ni alloy) and a surface of the hole portion of the wiring board has a layer structure of Cu/Sn/(Ni or Ni alloy).

* * * * *